United States Patent
Lee

(10) Patent No.: US 8,846,458 B2
(45) Date of Patent: Sep. 30, 2014

(54) ARRAY SUBSTRATE FOR IN-PLANE SWITCHING MODE LIQUID CRYSTAL DISPLAY DEVICE AND FABRICATING METHOD THEREOF

(71) Applicant: LG Display Co., Ltd., Seoul (KR)

(72) Inventor: Min-Jic Lee, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/948,329

(22) Filed: Jul. 23, 2013

(65) Prior Publication Data

US 2013/0309819 A1 Nov. 21, 2013

Related U.S. Application Data

(62) Division of application No. 13/177,814, filed on Jul. 7, 2011, now Pat. No. 8,519,396.

(30) Foreign Application Priority Data

Dec. 27, 2010 (KR) ........................ 10-2010-0135829

(51) Int. Cl.
| | |
|---|---|
| *H01L 21/00* | (2006.01) |
| *G02F 1/1362* | (2006.01) |
| *H01L 27/12* | (2006.01) |
| *H01L 29/66* | (2006.01) |
| *G02F 1/1343* | (2006.01) |
| *G02F 1/1368* | (2006.01) |
| *G02F 1/136* | (2006.01) |

(52) U.S. Cl.
CPC ........ *H01L 29/66765* (2013.01); *G02F 1/1368* (2013.01); *G02F 1/136213* (2013.01); *H01L 27/1255* (2013.01); *G02F 1/134363* (2013.01); *H01L 27/1288* (2013.01); *G02F 2001/13606* (2013.01)
USPC ............ 438/128; 438/149; 438/151; 438/155

(58) Field of Classification Search
CPC .......................... H01L 27/1214; H01L 29/786
USPC .................................. 438/128, 149, 151, 155
See application file for complete search history.

(56) References Cited

U.S. PATENT DOCUMENTS

| | | | |
|---|---|---|---|
| 7,180,563 | B2 | 2/2007 | Kim |
| 7,567,326 | B2 | 7/2009 | Lee |

(Continued)

FOREIGN PATENT DOCUMENTS

| | | |
|---|---|---|
| CN | 1287207 C | 11/2006 |
| JP | 2002-311455 A | 10/2002 |
| TW | 200900822 A | 1/2009 |

OTHER PUBLICATIONS

Office Action issued by the Taiwan Intellectual Property Office in Taiwanese Patent Application No. 100123570.

(Continued)

*Primary Examiner* — Tran Tran
(74) *Attorney, Agent, or Firm* — Morgan, Lewis & Bockius LLP

(57) ABSTRACT

An array for an in-plane switching (IPS) mode liquid crystal display device includes a gate line formed on a substrate to extend in a first direction, a common line formed on the substrate to extend in the first direction, a data line formed to extend in a second direction, a thin film transistor formed at an intersection between the gate line and the data line, wherein the thin film transistor includes a gate line, a gate insulating layer, an active layer, a source electrode, and a drain electrode, a passivation film formed on the substrate including the thin film transistor, a pixel electrode formed on the passivation film located on a pixel region defined by the gate line and the data line, the pixel electrode being electrically connected to the drain electrode, a common electrode formed on the passivation film, and a common electrode connection line connected to the common electrode and the common line, wherein the common electrode connection line overlaps with the common line and the drain electrode.

13 Claims, 9 Drawing Sheets

(56) References Cited

U.S. PATENT DOCUMENTS

| | | |
|---|---|---|
| 2002/0191138 A1 | 12/2002 | Matsumoto et al. |
| 2004/0027525 A1 | 2/2004 | Itakura et al. |
| 2004/0046919 A1* | 3/2004 | Kim .............................. 349/141 |
| 2005/0088601 A1 | 4/2005 | Lee |
| 2008/0204648 A1 | 8/2008 | Tanaka et al. |

OTHER PUBLICATIONS

Office Action dated Jan. 20, 2014, issued by the State Intellectual Property Office of China in Chinese Patent Application No. 201110308432.5.

* cited by examiner

ARRAY SUBSTRATE FOR IN-PLANE SWITCHING MODE LIQUID CRYSTAL DISPLAY DEVICE AND FABRICATING METHOD THEREOF

This application is a divisional of U.S. patent application Ser. No. 13/177,814, filed on Jul. 7, 2011, which claims the benefit of the Korean Patent Application No. 10-2010-0135829 filed on Dec. 27, 2010, the entire disclosure of each of which is hereby incorporated by reference for all purposes.

BACKGROUND OF THE INVENTION

1. Field of the Invention

The present invention relates to a liquid crystal display (LCD) device, and more particularly to an array substrate for an in-plane switching (IPS) mode LCD device and a fabricating method thereof.

2. Discussion of the Related Art

In general, an LCD device is driven using optical anisotropy and polarization of liquid crystal. The liquid crystal has a directivity in an arrangement of molecules due to its thin and long structure. The directivity of the arrangement of the liquid crystal molecules is controllable by applying an electric field to the liquid crystal.

When the direction of the arrangement of the liquid crystal molecules is voluntarily adjusted, the arrangement of the liquid crystal molecules changes, and light is refracted in the direction of the arrangement of the liquid crystal molecules by virtue of optical anisotropy of the liquid crystal, thereby displaying the image.

An Active Matrix (AM) LCD (AM-LCD, hereinafter, referred to as LCD device), in which thin film transistors (TFTs) and pixel electrodes connected to the TFTs are arranged in a matrix form, is known for its high resolution and superior video implementation capability.

The LCD device includes a color filter substrate (i.e., upper substrate) having common electrodes, an array substrate (i.e., lower substrate) having pixel electrodes, and a liquid crystal layer interposed between the upper and lower substrates. The LCD device having such structure is driven by vertical electric field created between the common electrodes and the pixel electrode. Accordingly, such structures have excellent properties such as transmittance, an aperture ratio, and the like.

However, such LCD devices have poor viewing angle properties. Thus, a newly introduced technique to overcome the drawback is a liquid crystal driving method using horizontal electric fields for the in-plane switching (IPS), which has improved viewing angle properties.

The IPS mode LCD device is configured to have the color filter substrate and the array substrate face each other, and have a liquid crystal layer interposed between the color filter substrate and the array substrate. The array substrate includes a TFT, a common electrode, and a pixel electrode located at each of a plurality of pixels defined on a transparent insulating substrate. The common electrode and the pixel electrode are spaced apart from each other in parallel on the same substrate. The color filter substrate includes black matrixes located in correspondence to positions of the gate line, the data line and the TFT all formed on the transparent insulating substrate, and a color filter located in accordance with a position of each pixel.

The liquid crystal layer is driven by horizontal fields between the common electrode and the pixel electrode. In the IPS mode LCD device having the structure, the common electrode and the pixel electrode are formed to be transparent to ensure luminance. However, end portions of the common electrode and the pixel electrode block light, thereby reducing the aperture ratio.

Hereinafter, description will be given to the structure of the array substrate for the related art IPS mode LCD device. FIG. 1 is a plane view of an array substrate for the related art IPS mode LCD device. FIG. 2 is a sectional view taken along the line III-III of FIG. 1, i.e., a sectional view of the array substrate for the IPS mode LCD device.

The array substrate for the related art IPS mode LCD device, as shown in FIGS. 1 and 2, includes a plurality of gate lines 13 and common lines 13b and 13c extending in one direction on a substrate 1 and spaced from each other in parallel, a plurality of data lines 21 intersecting with the gate lines 13 to define pixel regions at the intersections therebetween, a plurality of pixel electrodes 25a formed at the pixel regions defined by the gate lines 13 and the data lines 21, thin film transistors (TFTs) T disposed at the intersections of the gate lines 13 and the data lines 21. Each TFT T includes a gate electrode 13a, an active layer (not shown), a drain electrode 21b and a source electrode 21a, and common electrodes 25c disposed at the pixel regions defined by the gate lines 13 and the data lines 21, the common electrodes 25c being spaced apart from the pixel electrodes 25a.

The gate line 13 provides a scan signal from a gate driver (not shown). The data line 21 provides a video signal from a data driver (not shown). A gate insulating layer 15 is interposed between the gate line 13 and the data line 21.

The common lines 13b and 13c are formed simultaneously when forming the gate lines 13. The common line 13b is arranged to be parallel to the gate line 13, and the common line 13c is arranged to be perpendicular to the gate line 13. The common lines 13b and 13c are connected to each other. The common line 13c overlaps with the data line 21 having the gate insulating layer 15 interposed therebetween.

The TFT T allows the pixel electrode 25a to be charged with a pixel signal applied to the data line 21 by a scan signal applied to the gate line 13 and remain in the signal-charged state. The TFT T includes a gate electrode 13a connected to the gate line 13, a source electrode 21a connected to the data line 21, a drain electrode 21b facing the source electrode 21a and connected to the pixel electrode 25a, an active layer 17 overlapping with the gate electrode 13a having the gate insulating layer 15 interposed therebetween to form a channel between the source electrode 21a and the drain electrode 21b, and an ohmic contact layer 19 formed on the active layer 17. The ohmic contact layer 19 is formed on regions of the active layer 17 excluding the channel region between the source and drain electrodes 21a and 21b.

A plurality of transparent pixel electrodes 25a are disposed on the entire surface of the pixel region being spaced apart from the gate line 13 and the data line 21. The plurality of pixel electrodes 25a are electrically connected to the drain electrode 21b via a contact hole 23a formed through a lower passivation film 23. One end of the plurality of pixel electrodes 25a is connected together with a pixel electrode connection line 25b, which overlaps with the common line 13b.

As shown in FIG. 1, end portions of the plurality of common electrodes 25c spaced apart from the pixel electrodes 25a are connected together with a common electrode connection line 25d. The common electrode connection line 25d is electrically connected to the common line 13c via the common line contact hole 23b.

As shown in FIG. 2, in the structure of the array substrate for the related art LCD device, a first parasitic capacitor C1 is formed between the pixel electrode connection line 25b and the common line 13b with the gate insulating layer 15 and the passivation film 23 interposed therebetween, and a second parasitic capacitor C2 is formed between the drain electrode 21b and the common line 13b overlapping with the drain electrode 2 lb with the gate insulating layer 15 interposed therebetween.

The common electrodes 25c apply a reference voltage, i.e., a common voltage to each pixel in order to drive the liquid crystal. The pixel electrode 25a and the neighboring common electrodes 25c generate a horizontal field therebetween. Accordingly, when a video signal is applied to the pixel electrode 25a via the TFT T, the voltage difference between the pixel electrode 25a and the common electrodes 25c, to which a common voltage is applied, generates horizontal fields to rotate liquid crystal molecules arranged in a horizontal direction using dielectric anisotropy. The transmittance of light in the pixel region changes according to the rotation level of the liquid crystal molecules.

However, according to the related art, as shown in part "A" of FIG. 2, a first parasitic capacitor C1 is formed between the pixel electrode connection line 25b and the common line 13b, and a second parasitic capacitor C2 is formed between the drain electrode 21b and the common line 13b. The related art structure requires a space for forming such parasitic capacitors, which may cause an aperture ratio to be lowered accordingly. In particular, since the first and second parasitic capacitors C1 and C2 are formed horizontal rather than perpendicular to each other, they may occupy more area on the array substrate thereby lowering the aperture ratio accordingly.

SUMMARY OF THE INVENTION

Accordingly, the present invention is directed to an array substrate for an in-plane switching mode liquid crystal display device and a fabricating method thereof that substantially obviates one or more problems due to limitations and disadvantages of the related art.

An object of the present invention is to provide an array substrate for an in-plane switching (IPS) mode LCD device capable of increasing an aperture rate by reducing the area occupied by capacitors while maintaining the same sizes of the capacitors as those of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the array substrate for an in-plane switching mode liquid crystal display device and the fabricating method thereof includes a gate line formed on a substrate to extend in a first direction, a common line formed on the substrate to extend in the first direction, a data line formed to extend in a second direction, a thin film transistor formed at an intersection between the gate line and the data line, wherein the thin film transistor includes a gate line, a gate insulating layer, an active layer, a source electrode, and a drain electrode, a passivation film formed on the substrate including the thin film transistor, a pixel electrode formed on the passivation film located on a pixel region defined by the gate line and the data line, the pixel electrode being electrically connected to the drain electrode, a common electrode formed on the passivation film, and a common electrode connection line connected to the common electrode and the common line, wherein the common electrode connection line overlaps with the common line and the drain electrode.

In another aspect, the method for fabricating an array substrate for an in-plane switching (IPS) mode liquid crystal display device includes forming a gate line in a first direction, forming a common line in the first direction, forming a gate insulating layer on the gate line and the common line, forming a data line on the gate insulating layer in a second direction, forming a thin film transistor at an intersections between the gate line and the data line, wherein the thin film transistor includes a gate electrode, a gate insulating layer, an active layer, a source electrode, and a drain electrode, forming a passivation film on the data line and the thin film transistor, forming a pixel electrode on the passivation film located on a pixel region defined by the gate line and the data line, the pixel electrode being electrically connected to the drain electrode, forming a common electrode on the passivation film, and forming a common electrode connection line connected to the common electrode and the common line, wherein the common electrode connection line overlaps with the common line and the drain electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 6A to 6F show a process of fabricating a drain electrode contact hole and a common line contact hole.

DETAILED DESCRIPTION OF THE PREFERRED EMBODIMENTS

Reference will now be made in detail to the preferred embodiments of the present invention, examples of which are illustrated in the accompanying drawings.

Figure 1:
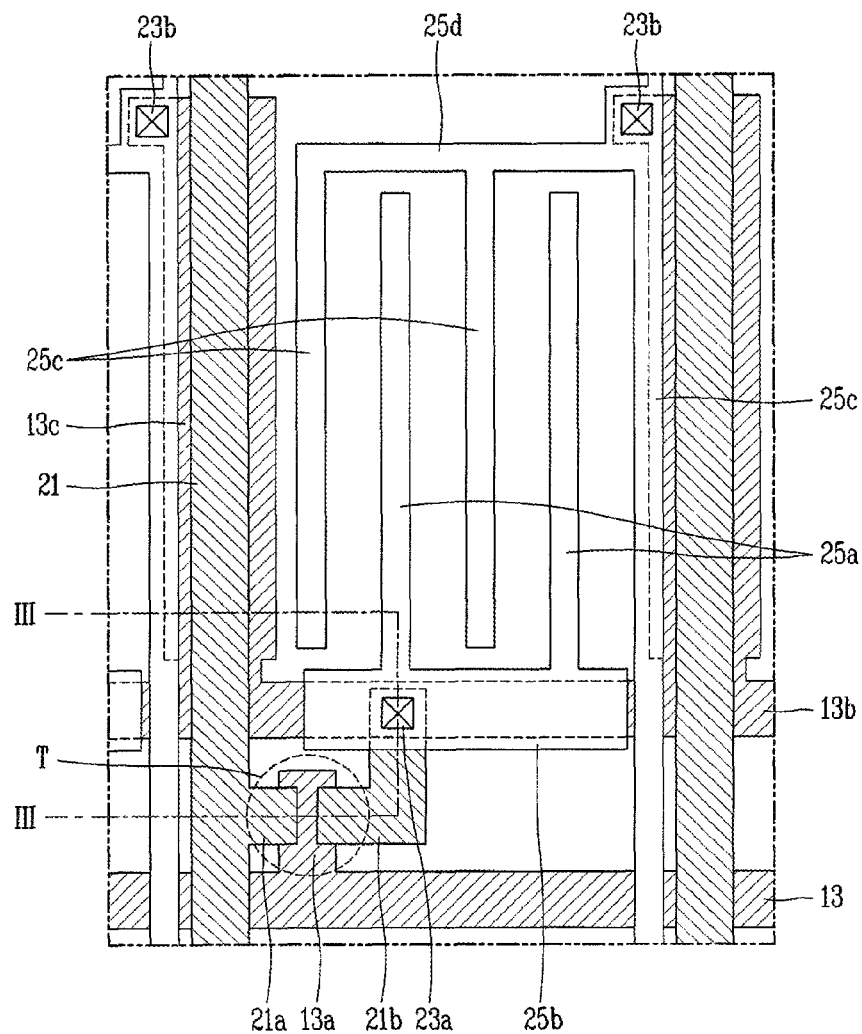
FIG. 1 is a plane view of an array substrate for an IPS mode LCD device according to the related art.
Figure 2:
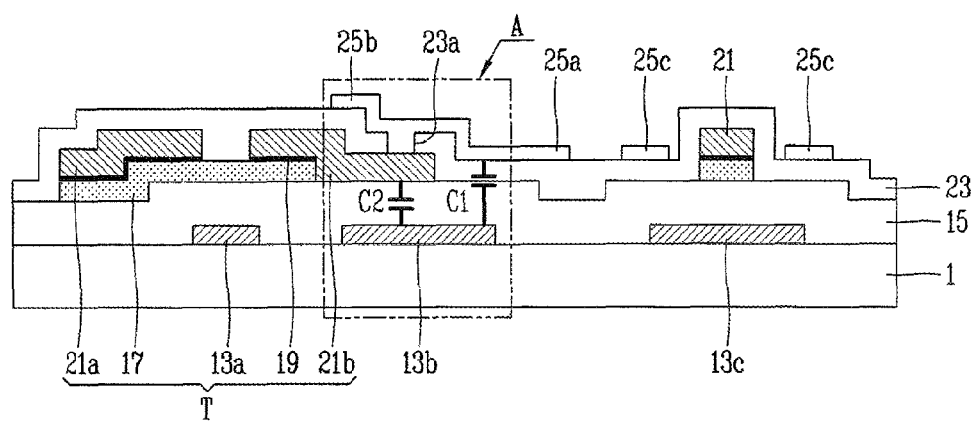
FIG. 2 is a sectional view taken along the line III-III of FIG. 1, which is a sectional view of the array substrate for the IPS mode LCD device.
Figure 3:
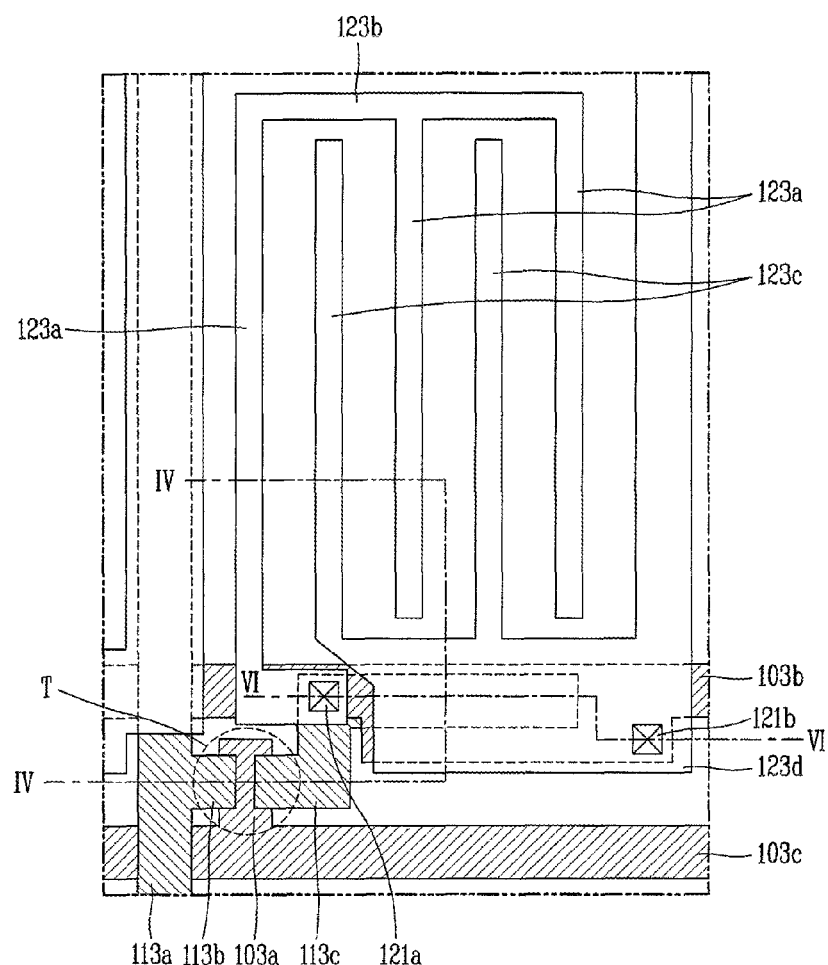
FIG. 3 is a plane view of an array substrate for an IPS mode LCD device in accordance with an exemplary embodiment of the present invention.
Figure 4:
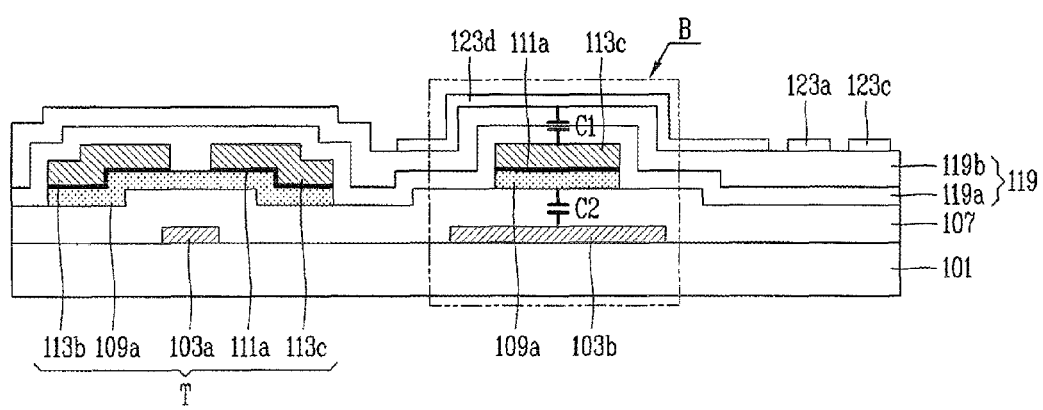
FIG. 4 is a sectional view taken along the line IV-IV of FIG. 3, which is a sectional view of the array substrate for the exemplary IPS mode LCD device.

FIG. 3 is a plane view of an array substrate for an IPS mode LCD device in accordance with an exemplary embodiment of the present invention. FIG. 4 is a sectional view taken along the line IV-IV of FIG. 3, which is a sectional view of the array substrate for the exemplary IPS mode LCD device.

The array substrate for an IPS mode LCD device in accordance with the present invention may include a plurality of gate lines 103c formed on a substrate 101 to extend in one direction and spaced from each other in parallel, common lines 103b formed on the substrate 101 spaced apart from the gate line 103c in parallel, a plurality of data lines 113a intersecting with the gate lines 103c to define pixel regions at the intersections therebetween, TFTs T each formed at the intersection between the gate line 103c and the data line 113a and each having a gate electrode 103a, a gate insulating layer 107, an active layer 109a, a source electrode 113b and a drain electrode 113c, a passivation film 119 having a dual structure including a lower passivation film 119a and an upper passivation film 119b formed on an entire substrate including the TFTs T, a plurality of pixel electrodes 123a arranged on the passivation film 119 located at each pixel region, defined by intersecting gate lines 103c and data lines 113a, and electrically connected to the drain electrode 113c, a plurality of common electrodes 123c arranged on the passivation film 119 spaced apart from the pixel electrodes 123a, common electrode connection lines 123d each overlapping with the common line 103b and the drain electrode 113c, and capacitors C1 and C2 formed between the common electrode connection line 123d and the drain electrode 113c and between the drain electrode 113c and the common line 103b, respectively. The capacitors C1 and C2 are vertically formed by interposing the dual-layered passivation film 119 and the gate insulating layer 107 therebetween, respectively. The thickness of each layer of the passivation film 119 may be 3000 Å to 5000 Å. One or more layers of the passivation film 119 may be formed of silicon nitride or silicon oxide.

The gate line 103c may provide a scan signal from a gate driver (not shown) and the data line 113a may provide a video signal from a data driver (not shown). The gate lines 103c and the data lines 113a may intersect with each other to define pixel regions at the intersections therebetween. The gate insulating layer 107 may be interposed between the gate lines 103c and the data lines 113a.

The gate line 103c may be formed in a multiple-layered structure having more than one or two layers, including a transparent conductive layer on the substrate 101. The gate line 103c may be formed in a multiple-layered structure by laminating a first conductive layer using a transparent conductive layer and a second conductive layer using a non-transparent metal, or a single-layered structure using a non-transparent metal. The first conductive layer may be implemented by using indium tin oxide (ITO), indium zinc oxide (IZO) or indium tin zinc oxide (ITZO), and the second conductive layer may be formed using one of copper (Cu), molybdenum (Mo), aluminum (Al), Cu alloy, Mo alloy and Al alloy.

The TFT T allows the pixel electrode 123a to be charged with and remain in the signal-charged state by pixel signal applied to the data line 113a and a scan signal applied to the gate line 103c. Each TFT T may include a gate electrode 103a included in the gate line 103c, a source electrode 113b connected to the data line 113a, a drain electrode 113c facing the source electrode 113c and connected to the pixel electrode 123a, an active layer 109a overlapping with the gate electrode 103a with the gate insulating layer 107 interposed therebetween and forming a channel between the source electrode 113b and the drain electrode 113c, and an ohmic contact layer 111a formed on the active layer 109a. The ohmic contact layer 111a may be formed on regions of the active layer 109a excluding the channel region between the source and drain electrodes 113b and 113c.

The drain electrode 113c may overlap with the lower common line 103b. The active layer 109a and the ohmic contact layer 111a may overlap with the data line 113a. The data line 113a may receive a pixel signal from the data driver (not shown) via a data pad (not shown). The plurality of transparent pixel electrodes 123a may be arranged to be spaced apart from each other on the entire pixel region, forming a gap from the gate line 103a and the data line 113a. The plurality of pixel electrodes 123a may be arranged to be parallel to the data line 113a. First end portions of the plurality of pixel electrodes 123a may be connected together with the pixel electrode connection line 123b, which is disposed perpendicular to the data line 113a. Second end portion of one of the plurality of pixel electrodes 123a adjacent to the data line 113a may be electrically connected to the drain electrode 113c via a drain electrode contact hole 121a formed at the dual-layered passivation film 119.

A plurality of common electrodes 123c may be formed on the entire pixel region in an alternating manner with the pixel electrodes 123a. The plurality of common electrodes 123c may be arranged to be parallel to the data line 113a. First end portions of the plurality of common electrodes 123c may be connected together via the common electrode connection line 123d formed perpendicular to the data line 113a. The common electrode connection line 123d may be electrically connected to the common line 103b via the common line contact hole 121b formed through the dual-layered passivation film 119. The common electrode connection line 123d may overlap with the drain electrode 113c and the common line 103b located at the lower side thereof.

As shown in part "B" of FIG. 4, the first and second capacitors C1 and C2 may be formed under the same area. In particular, the first capacitor C1 may be formed between the common electrode connection line 123d and the drain electrode 113c with the dual-layered passivation film 119 interposed therebetween, and the second capacitor C2 may be formed between the drain electrode 113c and the common line 103b with the gate insulating layer 107 interposed therebetween. In some cases, the active layer 109a may not be formed between the common line 103b and the drain electrode 113c configuring the second capacitor C2.

The plurality of common electrodes 123c may apply a reference voltage, i.e., a common voltage to each pixel in order to drive liquid crystal. The plurality of pixel electrodes 123a and the plurality of common electrodes 123c may generate horizontal fields on the passivation film 119 located at each pixel region.

Accordingly, when a video signal is applied to the pixel electrode 123a via the TFT T, the voltage difference between the pixel electrode 123a and the common electrodes 123c, to which the common voltage is applied, generates the horizontal fields such that the liquid crystal molecules arranged in a horizontal direction between a TFT substrate and a color filter substrate (not shown) can be rotated by dielectric anisotropy. Transmittance of light in the pixel region changes according to the rotation level of the liquid crystal molecules, thereby implementing gradation.

Hereinafter, description will be given of an exemplary method for fabricating the array substrate for the IPS mode LCD device in accordance with the present invention as shown in FIGS. 5 and 6. FIGS. 5A to 5N are sectional views showing an exemplary process of fabricating the array substrate for the exemplary IPS mode LCD device. FIGS. 6A to 6F are sectional views taken along the line VI-VI of FIG. 3, which are sectional views showing the exemplary process of fabricating the array substrate for the exemplary IPS mode LCD device. FIGS. 6A to 6F show a process of fabricating a drain electrode contact hole and a common line contact hole.

Figure 5A:
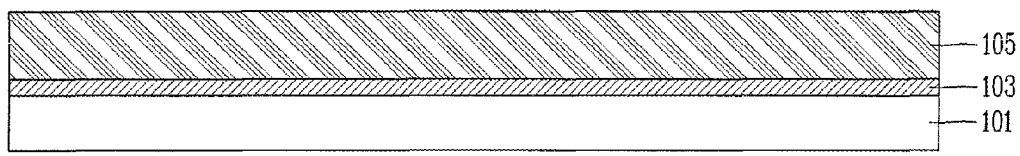
FIGS. 5A to 5N are sectional views showing an exemplary process of fabricating the array substrate for the exemplary IPS mode LCD device.

As shown in FIG. 5A, non-pixel regions as well as a plurality of pixel regions having switching regions are defined on a transparent substrate 101, on which a first conductive metal layer 103 is then deposited by sputtering. The first conductive metal layer 103 may be formed in a single-layered structure using one or more of aluminum (Al), tungsten (W), copper (Cu), molybdenum (Mo), chrome (Cr), titanium (Ti), Mo alloy, Cu alloy, Al ally and the like, or in a structure of at least two layers deposited, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo alloy/Al alloy, Mo/Al alloy, Cu/Mo alloy, Cu/Mo(Ti) or the like. A photoresist having high transmittance is deposited on the first conductive metal layer 103 to form a first photosensitive film 105.

Figure 5B:
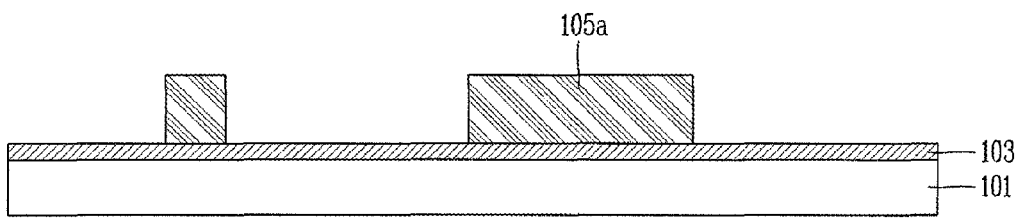

As shown in FIG. 5B, the first photosensitive film 105 is exposed and developed through a photolithography using masks (not shown), and selectively removed so as to form first photosensitive film patterns 105a. The first photosensitive film patterns 105a remain merely on a gate line forming region and a common line forming region.

Figure 5C:
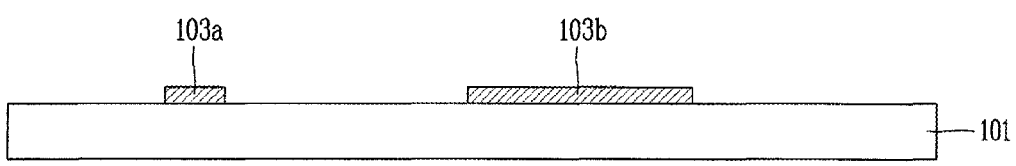

As shown in FIG. 5C, the first conductive metal layer 103 is selectively patterned using the first photosensitive film patterns 105a as shielding films to form a gate line (not shown, see 103c of FIG. 4), a gate electrode 103a extending from the gate line 103c, and a common line 103b.

Figure 5D:
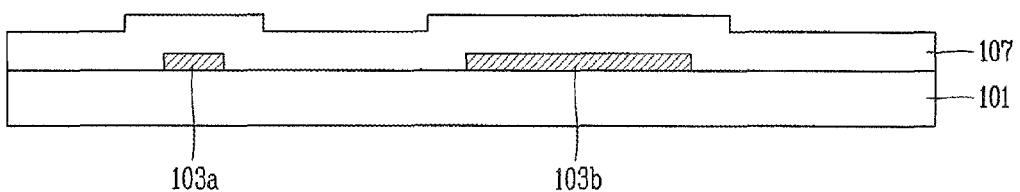

As shown in FIG. 5D, after removing the first photosensitive film patterns 105a, a gate insulating layer 107 is deposited on the entire substrate. The gate insulating layer 107 may be made of silicon nitride (SiNx) or silicon oxide (SiO2).

Figure 5E:
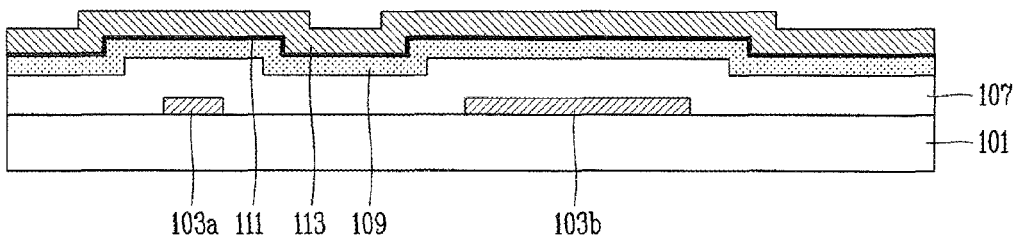

As shown in FIG. 5E, an amorphous silicon layer (a-Si:H) 109, an amorphous silicon layer (n+ or p+) 111 containing impurities and a second conductive metal layer 113 are sequentially deposited on the entire surface of the substrate 101, on which the gate insulating layer 107 is formed. The amorphous silicon layer (a-Si:H) 109 and the impurity containing amorphous silicon layer (n+ or p+) 111 may be deposited by a chemical vapor deposition (CVD) method. The second conductive metal layer 113 may be deposited by sputtering. The CVD method and the sputtering are merely exemplary deposition methods, and other deposition methods may also be employed. The second conductive metal layer 113 may be formed in a single-layered structure using one or more of aluminum (Al), tungsten (W), copper (Cu), molybdenum (Mo), chrome (Cr), titanium (Ti), Mo alloy, Cu alloy, Al ally and the like, or in a structure of at least two layers deposited, such as Al/Cr, Al/Mo, Al(Nd)/Al, Al(Nd)/Cr, Mo/Al(Nd)/Mo, Cu/Mo, Ti/Al(Nd)/Ti, Mo/Al, Mo alloy/Al alloy, Mo/Al alloy, Cu/Mo alloy, Cu/Mo(Ti) or the like.

Figure 5F:
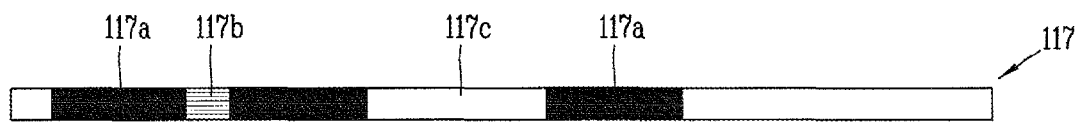
Figure 5F:
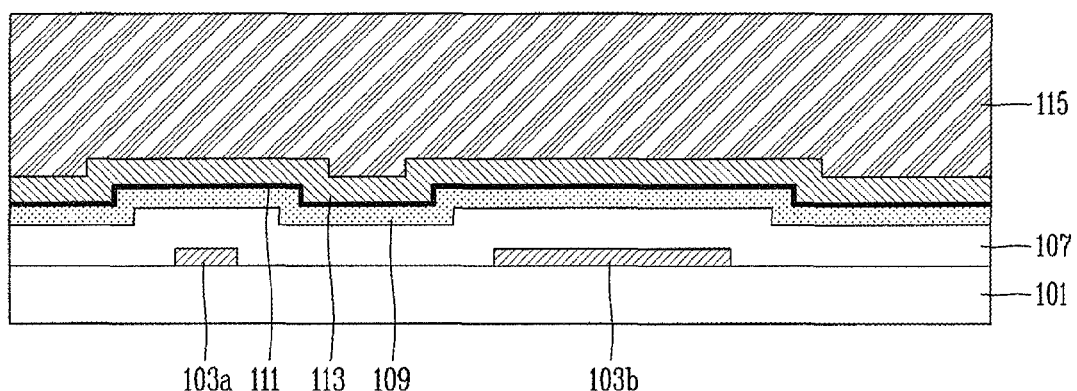

As shown in FIG. 5F, a second photosensitive film 115 having high transmittance is deposited on the second conductive metal layer 113. Afterwards, an exposure process is executed for the second photosensitive film 115 using a diffraction mask 117 including light blocking portions 117a, a semi-transparent portion 117b and a transparent portion 117c. The light blocking portions 117a of the diffraction mask 117 is located above the second photosensitive film 115 corresponding to a data line forming region and source and drain electrode forming regions. The semi-transparent portion 117b of the diffraction mask 117 is located above the second photosensitive film 115 corresponding to a channel region of the TFT T, i.e., the gate electrode 103a. Instead of the diffraction mask 117, a mask using light diffraction effects, a half-tone mask, or other masks may be used.

Figure 5G:
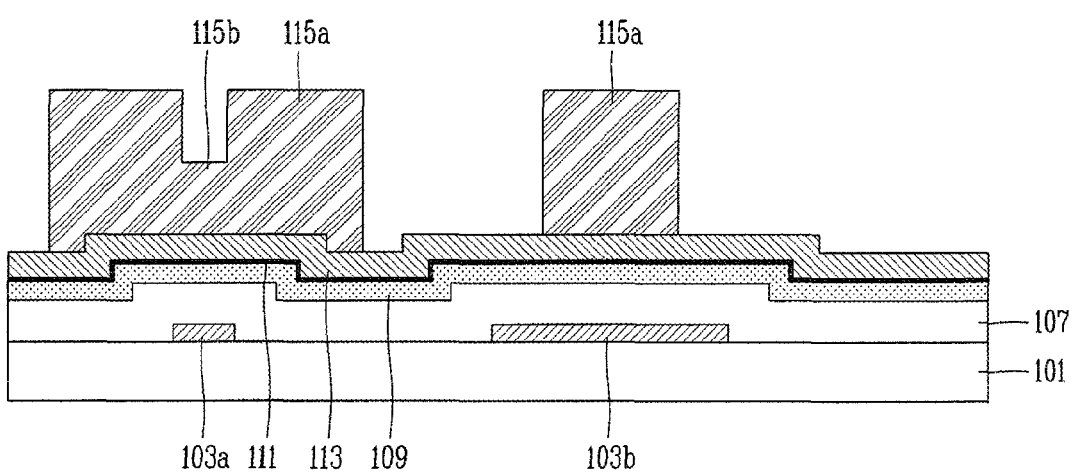

As shown in FIG. 5G, after performing a development process following the exposure process, the second photosensitive film 115 is selectively patterned to form first patterns 115a on the data line forming region and the source and drain electrode forming regions, and a second pattern 115b on the channel region of the TFT T. The first patterns 115a located on the data line forming region and the source and drain electrode forming regions are not allowed to transmit light therethrough. Accordingly, they maintain the thickness of the second photosensitive film 115. However, the second pattern 115b located on the channel region of the TFT T is removed by a predetermined thickness due to light being partially transmitted into the second photosensitive film 115. In particular, the second pattern 115b located on the channel region of the TFT T is thinner than the first patterns 115a located on the data line forming region and the source and drain electrode forming regions.

Figure 5H:
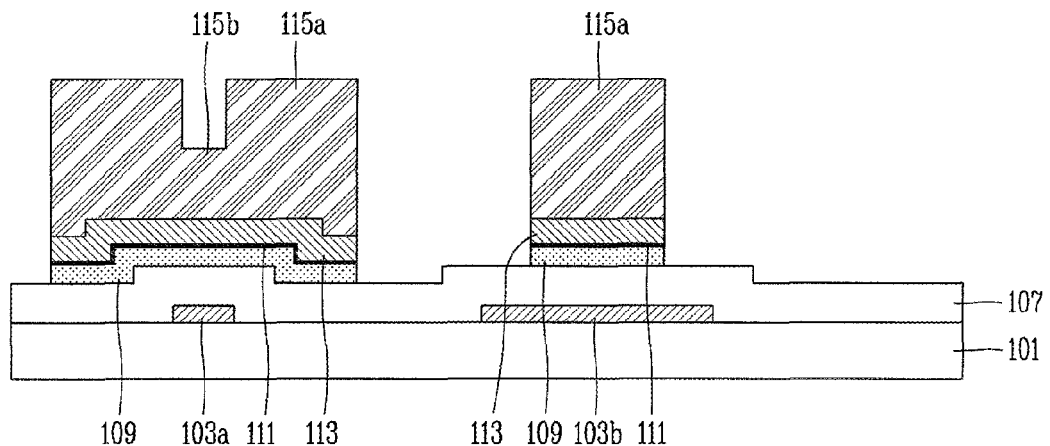

As shown in FIG. 5H, the first patterns 115a located on the data line forming region and the source and drain electrode forming regions and the second pattern 115b located on the channel region of the TFT T are used as masks to selectively pattern the second conductive metal layer 113, the impurity containing amorphous silicon layer 111, and the amorphous silicon layer 109, thereby forming a data line (not shown, see 113a of FIG. 3) and an active layer 109a, and simultaneously defining the source electrode forming region and the drain electrode forming region. The impurity containing amorphous silicon layer 111 and the amorphous silicon layer 109, the second conductive metal layer 113 may first be selectively etched through a wet etching, and then the impurity containing amorphous silicon layer 111 and the amorphous silicon layer 109 may be etched through a dry etching.

Figure 5I:
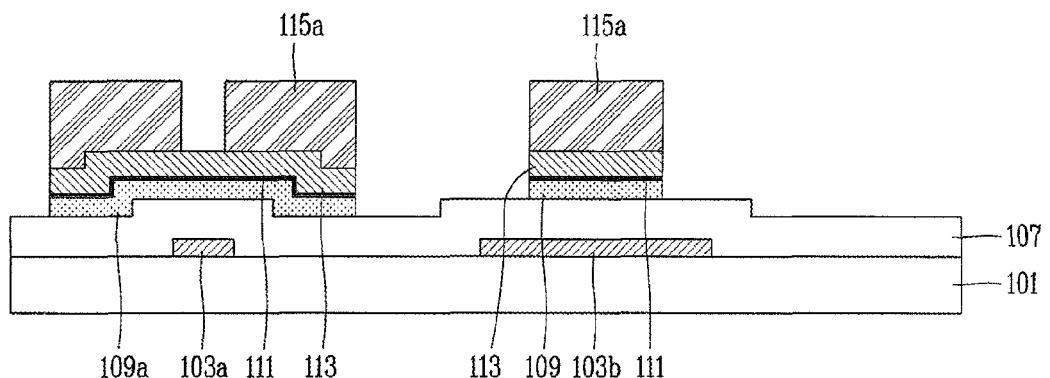

As shown in FIG. 5I, the second pattern 115b located on the channel region of the TFT T is completely removed through an ashing process, thereby exposing a portion of the second conductive metal layer 113 beneath the second pattern 116b located on the channel region of the TFT T. During the ashing process, the first patterns 115a located on the data line forming region and the source and drain electrode forming regions are also partially removed by a predetermined thickness. In particular, the first patterns 115a formed on the data line forming region and the source and drain electrode forming regions are partially etched during the ashing process.

Figure 5J:
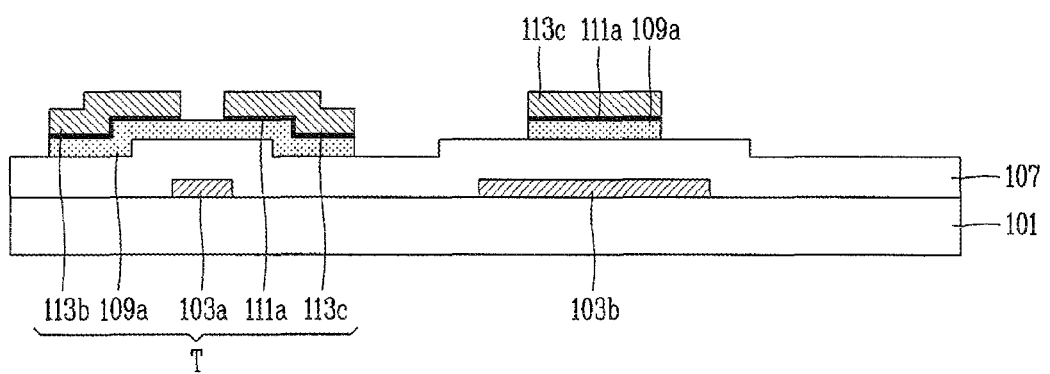

As shown in FIG. 5J, the exposed second conductive metal layer 113 is etched through wet etching using the first patterns 115a as a mask, thereby forming a source electrode 113b and a drain electrode 113c spaced apart from the source electrode 113b.

Afterwards, although not shown, the impurity containing amorphous silicon layer 111 located on the channel region is also removed through the dry etching to form an ohmic contact layer 111a exposing the channel region of the active layer 109a, thereby forming a TFT T including the gate electrode 103a, the gate insulating layer 107, the active layer 109a, the ohmic contact layer 111a, the source electrode 113b, and the drain electrode 113c.

Figure 5K:
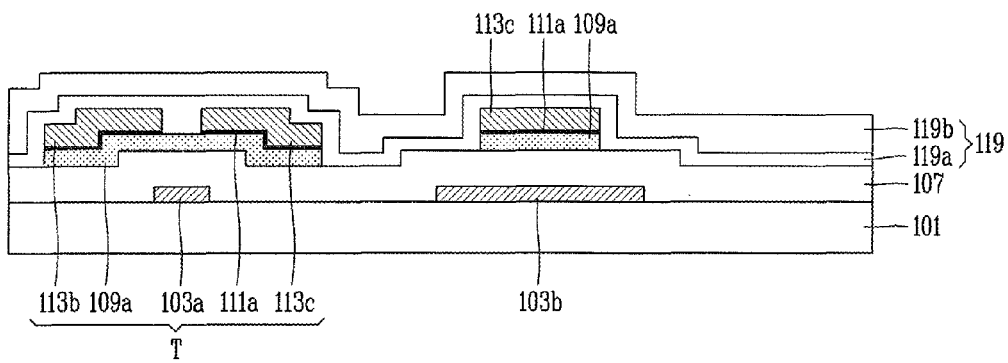
Figure 6A:
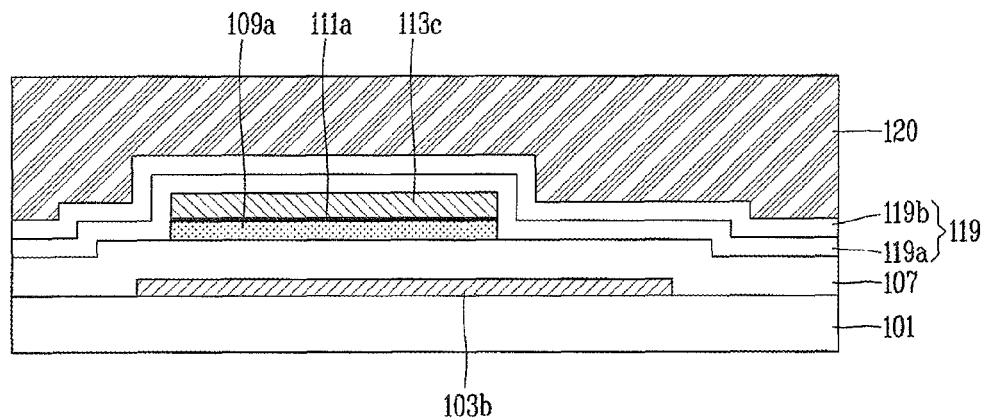
FIGS. 6A to 6F are sectional views taken along the line VI-VI of FIG. 3, which are sectional views showing the exemplary process of fabricating the array substrate for the exemplary IPS mode LCD device.

As shown in FIGS. 5K and 6A, a lower passivation film 119a is deposited on the entire substrate having the TFT T, and an upper passivation film 119b is deposited on the lower passivation film 119a. The lower and upper passivation films 119a and 119b may be made of an inorganic insulating material. Further, the lower and upper passivation films 119a and 119b may form a passivation film 119 having a dual-layered structure. Afterwards, a photoresist having high transmittance is deposited on the dual-layered passivation film 119 to form a third photosensitive film 120.

Figure 6B:
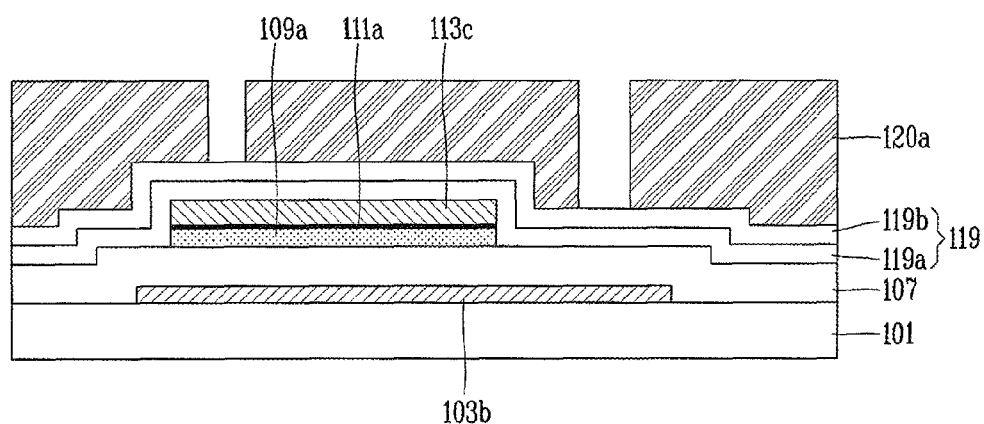

As shown in FIG. 6B, the photosensitive film 120 is exposed and developed through a photolithography using masks (not shown) and selectively patterned to form third photosensitive film patterns 120a.

Figure 6C:
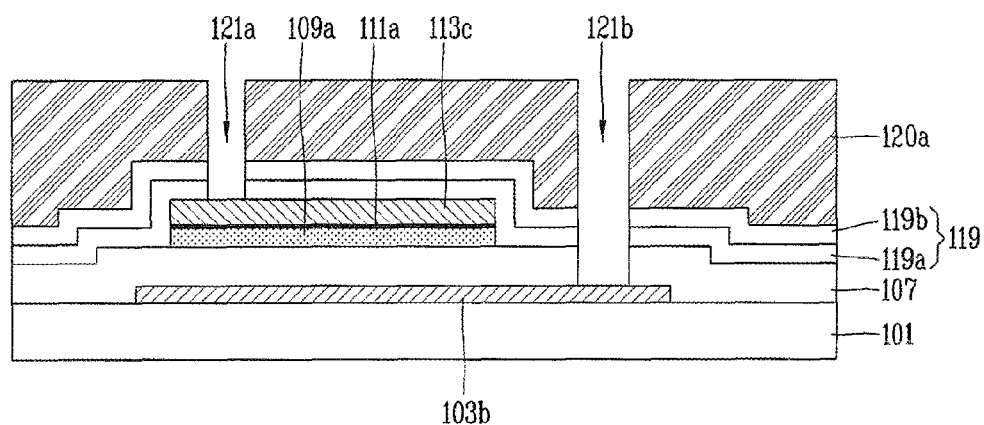

As shown in FIG. 6C, the dual-layered upper and lower passivation films 119b and 119a are selectively removed using the third photosensitive film pattern 120a as a mask to form a drain electrode contact hole 121a for exposing the drain electrode 113c. The dual-layered upper and lower passivation films 119b and 119a and the gate insulating layer 107 located beneath the passivation film 119 are selectively removed to form a common line contact hole 121b for exposing the common line 103b.

Figure 5L:
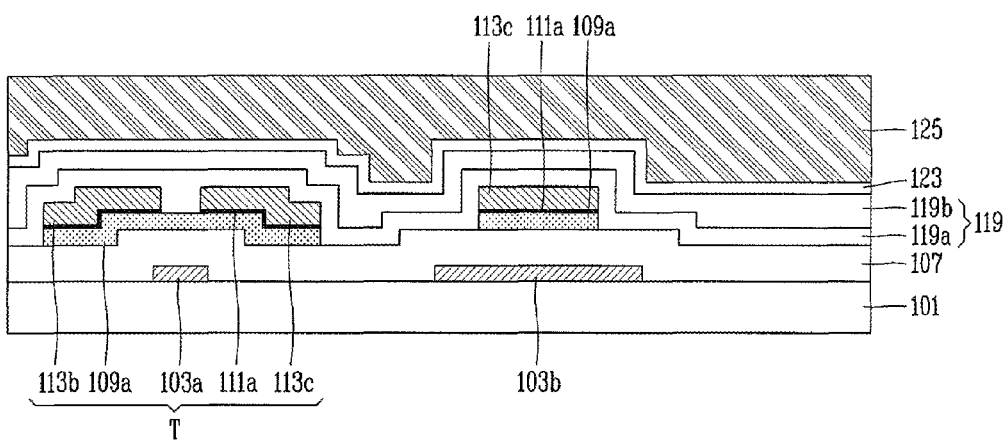
Figure 6D:
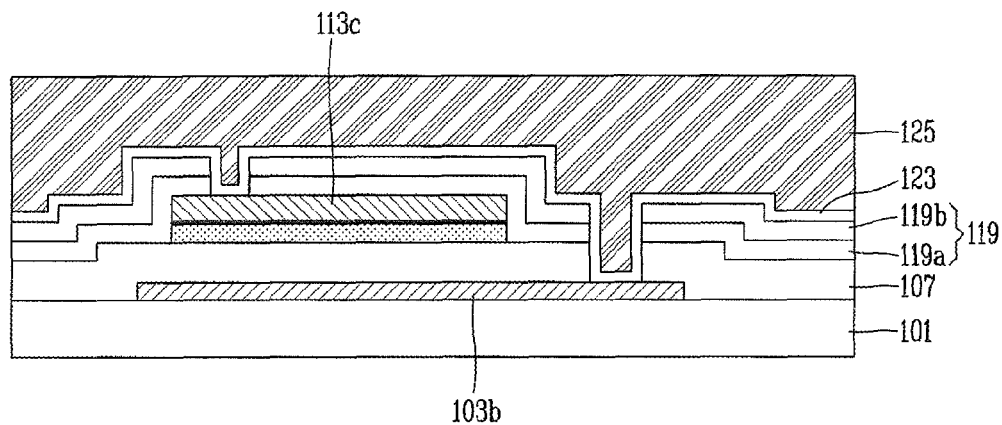

As shown in FIGS. 5L and 6D, after removing the third photosensitive film patterns 120a, a transparent conductive material layer 123 is deposited, through sputtering, on the passivation film 119 including the drain electrode contact hole 121a and the common line contact hole 121b. The transparent conductive material layer 123 may be made of indium tin oxide (ITO), indium zinc oxide (IZO), or the like. A photoresist having high transmittance is then deposited on the transparent conductive material layer 123 to form a fourth photosensitive layer 125.

Figure 5M:
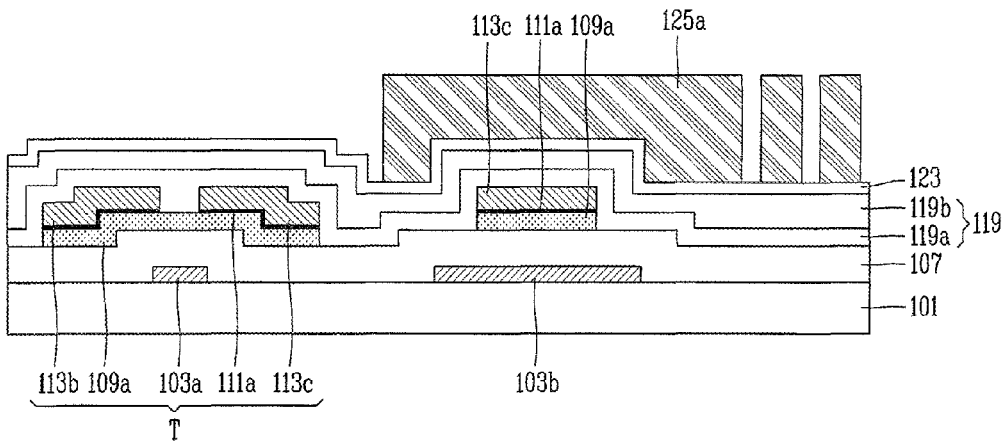
Figure 6E:
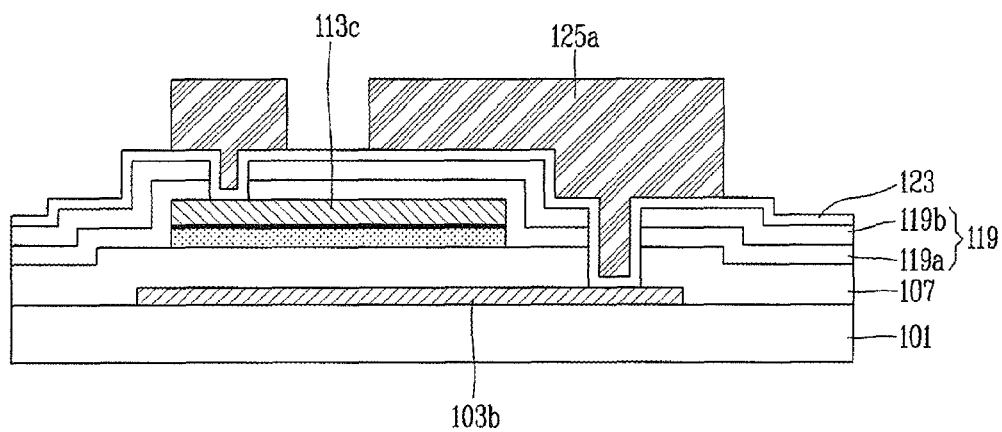

As shown in FIGS. 5M and 6E, the fourth photosensitive film 125 is exposed and developed through a photolithography using masks (not shown), and selectively patterned to form fourth photosensitive film patterns 125a.

Figure 5N:
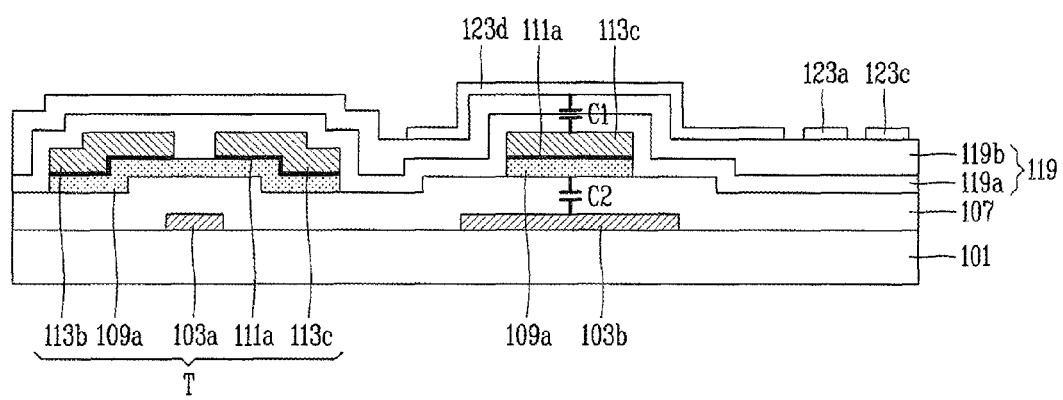
Figure 6F:
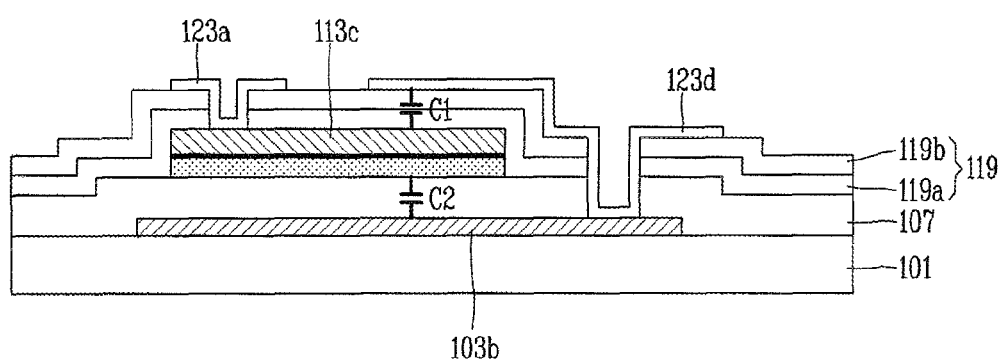

As shown in FIGS. 5N and 6F, the transparent conductive material layer 123 is selectively patterned using the fourth photosensitive film patterns 125a as masks, thereby simultaneously forming a plurality of pixel electrodes 123a, which are electrically connected to the drain electrode 113c via the drain electrode contact hole 121a, and a plurality of common electrodes 123c, which are electrically connected to the common line 103b via the common line contact hole 121b. The plurality of pixel electrodes 123a may be disposed, being spaced apart from one another, on the pixel region defined by the gate lines 103a and the data lines 113a. The plurality of pixel electrodes 123a may be disposed to be parallel to the data lines 113a. First end portions of the plurality of pixel electrodes 123a may be connected together by a pixel electrode connection line 123b disposed perpendicular to the data lines 113a. Second end portion of one of the plurality of pixel electrodes 123a adjacent to the data line 113a, of the plurality of pixel electrodes 123a, is electrically connected to the drain electrode 113c via the drain electrode contact hole 121a formed on the dual-layered passivation film 119.

The plurality of common electrodes 123c may be formed by being spaced apart from the pixel electrodes 123a in an alternating manner. The plurality of common electrodes 123c may be disposed to be parallel to the data lines 113a. First end portions of the plurality of common electrodes 123c may be connected together by a common electrode connection line 123d disposed perpendicular to the data lines 113a. The common electrode connection line 123d may be electrically connected to the common line 103b via the common line contact hole 121b formed through the dual-layered passivation films 119a and 119b. The common electrode connection line 123d may overlap with the drain electrode 113c and the common line 103b located at the lower side thereof.

Accordingly, as shown in FIGS. 5N and 6F, under the same area, first and second capacitors C1 and C2 are formed. In this exemplary embodiment, the first capacitor C1 is formed between the common electrode connection line 123d and the drain electrode 113c, which are vertically disposed with the dual-layered passivation film 119 interposed therebetween. Further, the second capacitor C2 is formed between the drain electrode 113c and the common line 103b, which are vertically disposed with the gate insulating film 107 interposed therebetween. Although not shown, the remaining fourth photosensitive film pattern 125a is removed, thereby completing the fabrication process of the array substrate for the IPS mode LCD device. Afterwards, although not shown, a color filter substrate fabrication process and a process of filling a liquid crystal layer between the array substrate and the color filter substrate are performed, thereby fabricating the IPS mode LCD device.

As described above, in accordance with an array substrate for an IPS mode LCD device and a fabricating method thereof in this specification, capacitors can simultaneously be formed between a common electrode connection line and a drain electrode and between the drain electrode and a common line, wherein a dual-layered passivation film and a gate insulating film are interposed between the capacitors, respectively. Therefore, the number of capacitors per area can be increased, resulting in an increase in the aperture rate.

In the array substrate for the IPS mode LCD device and the fabricating method thereof, to overcome the drawback that short defect may easily be caused between a data line and a common electrode connection line due to foreign materials generated during processes when a single-layered passivation film is formed between the data line and the common electrode connection line, a dual-layered passivation film can be formed to minimize and/or prevent the short defect generated between the data line and the common electrode connection line.

It will be apparent to those skilled in the art that various modifications and variations can be made in the array substrate for an in-plane switching mode liquid crystal display device and a fabricating method thereof of the present invention without departing from the spirit or scope of the invention. Thus, it is intended that the present invention cover the modifications and variations of this invention provided they come within the scope of the appended claims and their equivalents.

What is claimed is:

1. A method for fabricating an array substrate for an in-plane switching (IPS) mode liquid crystal display device, the method comprising:
    forming a gate line in a first direction;
    forming a common line in the first direction;
    forming a gate insulating layer on the gate line and the common line;
    forming a data line on the gate insulating layer in a second direction;
    forming a thin film transistor at an intersections between the gate line and the data line, wherein the thin film transistor includes a gate electrode, the gate insulating layer, an active layer, a source electrode, and a drain electrode;
    forming a passivation film on the data line and the thin film transistor;
    forming a pixel electrode on the passivation film located on a pixel region defined by the gate line and the data line, the pixel electrode being electrically connected to the drain electrode;
    forming a common electrode on the passivation film; and
    forming a common electrode connection line connected to the common electrode and the common line,
    wherein the common electrode connection line overlaps with the common line and the drain electrode.

2. The method of claim 1, wherein the passivation film includes multiple passivation layers.

3. The method of claim 1, wherein the passivation film is a dual-layered passivation film including a lower passivation film and an upper passivation film.

4. The method of claim 1, wherein a first capacitor is formed between the common electrode connection line and the drain electrode with a passivation film interposed therebetween.

5. The method of claim 4, wherein a second capacitor is formed between the drain electrode and the common line with the gate insulating film interposed therebetween.

6. The method of claim 5, wherein the first and second capacitors are formed in series.

7. The method of claim 1, wherein the pixel electrode is connected to a pixel electrode connection line.

8. The method of claim 1, wherein the pixel electrode is connected to the drain electrode via a drain electrode contact hole formed through the passivation film, and the common electrode connection line is connected to the common line via a common line contact hole formed through the passivation film and the gate insulating film.

9. The method of claim 8, wherein the drain electrode contact hole and the common electrode contact hole are simultaneously formed.

10. The method of claim 1, wherein the first direction is perpendicular to the second direction.

11. The method of claim 1, wherein the thickness of the passivation film is 3000 Å to 5000 Å.

12. The method of claim 1, wherein the passivation film is formed of silicon nitride or silicon oxide.

13. The method of claim 1, wherein the pixel electrode and the common electrode are simultaneously formed.

* * * * *